(12) United States Patent
Oh

(10) Patent No.: US 7,369,451 B2
(45) Date of Patent: May 6, 2008

(54) DYNAMIC RANDOM ACCESS MEMORY DEVICE AND METHOD FOR SELF-REFRESHING MEMORY CELLS

(75) Inventor: HakJune Oh, Kanata (CA)

(73) Assignee: Mosaid Technologies Incorporated, Kanata, Ontario (CA)

( * ) Notice: Subject to any disclaimer, the term of this patent is extended or adjusted under 35 U.S.C. 154(b) by 321 days.

(21) Appl. No.: 11/261,493

(22) Filed: Oct. 31, 2005

(65) Prior Publication Data

US 2007/0097677 A1    May 3, 2007

(51) Int. Cl.
*G11C 7/00* (2006.01)
(52) U.S. Cl. .................................. 365/222; 365/189.05
(58) Field of Classification Search ................ 365/222, 365/189.05, 233
See application file for complete search history.

(56) References Cited

U.S. PATENT DOCUMENTS

| | | | |
|---|---|---|---|
| 4,636,989 A | 1/1987 | Ikuzaki | |
| 5,365,487 A | 11/1994 | Patel et al. | |
| 5,566,117 A | 10/1996 | Okamura et al. | |
| 5,862,093 A | 1/1999 | Sakakibara | |
| 6,741,515 B2 | 5/2004 | Lazar et al. | |
| 6,922,369 B2 | 7/2005 | Kim | |
| 7,286,377 B1 * | 10/2007 | Pyeon | 365/22 |

* cited by examiner

*Primary Examiner*—Son Dinh
(74) *Attorney, Agent, or Firm*—Shin Hung; Borden Ladner Gervais LLP

(57) ABSTRACT

A dynamic random access memory (DRAM) device having memory cells is operated in a self-refresh mode and a normal mode. A mode detector provides a self-refresh mode signal in the self-refresh mode of operation. It includes a free-running oscillator for generating an oscillation signal independent of the self-refresh mode signal. In response to the oscillation signal, a self-request controller provides a self-refresh request signal in the self-refresh mode. The self-refresh signal is asynchoronized with the self-fresh mode signal and is provided to an address circuit to select a wordline for refreshing the memory cells thereof. The self-refresh request controller includes logic circuitry for arbitrating timing between initial active edges of the oscillation signal and the self-refresh mode signal and providing the self-refresh request and ceasing it, regardless of conflict between the self-refresh mode signal and the oscillation signal upon self-refresh mode entry and exit. The DRAM devices perform and achieve reliable self-refresh for variable DRAM cell retention time.

22 Claims, 10 Drawing Sheets

DYNAMIC RANDOM ACCESS MEMORY DEVICE AND METHOD FOR SELF-REFRESHING MEMORY CELLS

TECHNICAL FIELD

The present invention generally relates to a semiconductor integrated circuit and in particular to a dynamic random access memory device with a self-refresh function and a method for self-refreshing the data storage cells of a dynamic random access memory.

BACKGROUND INFORMATION

In dynamic random access memory (DRAM) integrated circuit devices, DRAM cell arrays are typically arranged in rows and columns such that a particular DRAM cell is addressed by specifying its row and column within the array. A wordline connects a row of cells to a set of bitline sense amplifiers that detect the data in the cells. In a read operation, a subset of the data in the sense amplifiers is then chosen, or "column-selected" for output. DRAM cells are "dynamic" in the sense that the stored data, typically in the form of charged and discharged storage capacitors, will dissipate after a relatively short period of time. Thus, in order to retain the information, the contents of the DRAM cells must be refreshed. The charged or discharged state of the storage capacitor must be reapplied to an individual memory cell in a repetitive manner. The maximum amount of time allowable between refreshing operations is determined by the charge storage capabilities of the capacitors that make up the DRAM cell array. DRAM manufacturers typically specify a refresh time for which it guarantees data retention in the DRAM cells.

A refresh operation is similar to a read operation, but no data is output. The sensing of the data in the cells by the sense amplifiers is followed by a restoring operation that results in the data being rewritten to the cells. The data is, thus, "refreshed". The refresh operation is performed by enabling a wordline according to a row address, and enabling a sense amplifier. In addition, the refresh operation may be carried out by operating the sense amplifier without receiving an external refresh address. In this case, a refresh address counter that is integrated in a DRAM chip generates a row address subsequent to receiving an external start address.

Refresh operation is categorized as "auto-refresh" and "self-refresh". The auto-refresh operation occurs when, during operation of the chip, a refresh command is periodically generated and received. During the auto-refresh, the receipt of other commands to the chip is interrupted and refresh is carried out. Then, the chip is allowed to receive and act on the other commands. The self refresh function is one for performing refresh operations within the DRAM when in a standby mode to retain the data written in its memory cells.

In order to perform the self-refresh operation, regular internal reading of cell data and rewriting that data are established in order to prevent data losses when the chip is operating in a so-called "sleep" mode. An internal timer controls the frequency of self-refresh. The self-refresh control circuitry is comprised of an internal oscillator, a frequency divider and a refresh count request block. Temperature monitoring and variable refresh rate control circuitry can be included. In known dynamic DRAM integrated circuits having a self-refresh function, an operation mode is automatically switched to a self-refresh mode to perform self-refresh when required.

U.S. Pat. No. 4,636,989 granted to Ikuzaki on Jan. 13, 1987 discloses a dynamic MOS random access memory having an automatic refresh circuit. In the memory, a clock generator generates refresh clock pulses when the address strobe signal is not produced. U.S. Pat. No. 5,365,487 granted to Patel et al. on Nov. 15, 1994 discloses a DRAM with self-refresh management. U.S. Pat. No. 5,862,093 granted to Sakakibara on Jan. 19, 1999 discloses a dynamic memory device with refreshing timing signals generated to detect the relevant time to perform self-refresh.

In order to obtain high-speed operation and high-density integrated circuits, deep sub-micron CMOS processes like 90 nm, 65 nm, 45 nm have been introduced and implemented in many semiconductor IC devices. For those deep sub-micron processes, MOS transistors are scaled down (i.e., have minimum transistor dimensions decreased) and threshold voltage Vth of the transistors are lowered. However, the lowered threshold voltage results in significant sub-threshold leakage (i.e., leakage current present for transistor gate voltages below a threshold voltage) and therefore, semiconductor ICs based on such lowered threshold voltages consume more power in normal operation as well as in a power saving mode of operation. Since a DRAM cell includes a minimally sized access transistor for coupling the storage capacitor to a bitline, the stored charge can quickly leak from the storage capacitor. Therefore, more frequent "self-refresh" operations are required.

Semiconductor integrated circuits (ICs) are becoming smaller to accommodate more transistors in a single chip and to achieve faster operating speeds. However, smaller and faster CMOS type transistors have higher leakage currents and this leakage current issue is becoming a serious design challenge in nanometer technology devices. To reduce standby power consumption of DRAM devices, a "sleep" mode is provided from external DRAM control logic. In the "sleep" mode, DRAM cells are required to be "refreshed" periodically in order to retain cell data. This is accomplished using "self-refresh". However, smaller and faster CMOS transistors have significant leakage problems, resulting in the requirement for more frequent "self-refresh" operations than older DRAM technologies having lower leakage current issues. Even more seriously, most embedded DRAM macros (DRAM memory circuit blocks used in larger system-on-chip applications) fabricated with a sub-100 nm logic process require very frequent "self-refresh" because of the small cell capacitance values in certain worst case conditions, like high temperatures, very fast transistor process and very high power supply level, etc. This process, voltage and temperature (PVT) combination can easily vary during the manufacturing and/or device operation period. Therefore, the internal self-oscillator for the self-refresh signal generation should be able to cover a wide range of DRAM cell retention times due to PVT variations.

The variable range of DRAM cell retention time may fall between a few microseconds and few milliseconds if the process technology moves to 45 nm or less. Accordingly, upon receipt of a self-refresh mode entry request, the internal oscillator for self-refresh has to be initialized to generate the self-refresh signal in a very short period of time. The self-refresh signal must be produced to properly perform self-refresh for the shortest possible cell retention time (e.g., microsecond order) and also be maintained for the longest possible cell retention time (e.g., millisecond order) for long periods of reliable oscillation characteristics. It is, thus, sought for DRAM devices to perform and achieve reliable self-refresh, even though the cell retention time is variable across a wide range.

SUMMARY OF THE INVENTION

It is an object of the present invention to provide an improved dynamic random access memory (DRAM) having a self-refresh function and an improved method for self-refreshing the memory cells of a DRAM device.

In accordance with one aspect of the present invention, there is provided a dynamic random access memory (DRAM) device selectively operated in a self-refresh mode and a non self-refresh mode. The DRAM device includes a detection circuit for providing a self-refresh mode signal in response to the refresh mode selection. In the DRAM device, an oscillation circuit produces an oscillation signal in response to a DRAM power indication signal. A self-refresh request circuit provides a self-refresh request signal in response to the self-refresh mode signal and the oscillation signal. A refresh address circuit provides a refresh address of DRAM cells to be refreshed in response to the self-refresh request signal.

For example, the self-refresh request circuit enables and disables the self-refresh request signal in response to an entry into and an exit from the self-refresh mode, respectively. Also, an example of the oscillation circuit is a free-running oscillator for generating the oscillation signal. The free-running oscillator commences the generation of the oscillation signal in response to the power signal. The free-run oscillation continues until it becomes unnecessary. The self-refresh request circuit, as an AND circuit, gates and passes the oscillation signal based on the self-refresh mode signal as the self-refresh request signal. Because the oscillation signal is produced from the free-run self-refresh oscillation, independent of the self-refresh mode signal, the oscillator is not required to be initiated by the self-refresh mode signal. Thus, the cell retention time of the DRAM device is not limited by the oscillator's initiation time. It is, therefore, possible of self-refreshing the DRAM cells for very wide range of cell retention time. The free-run oscillation signal is generated without synchronizing with the entry and exit of the self-refresh and there is a possible conflict between the oscillation signal and the self-refresh mode signal.

Advantageously, the self-refresh request circuit performs arbitration function for critical timing situations between the oscillation signal and the self-refresh mode signal. For example, the arbitration function is achieved by a logic circuit having a latch circuit. The latch circuit detects the signal conflict and holds it until the next relevant transition of a pulse's logic state to provide a pulse of the self-refresh request signal. The arbitration function provided by the latch circuit prevents both a malfunction of the first self-refresh attempt after the entry of self-refresh mode and a malfunction of the last self-refresh attempt after the exit of the self-refresh mode.

In accordance with another aspect of the present invention, there is provided a method for self-refreshing a DRAM device having memory cells operated in a self-refresh mode and a non self-refresh mode. By the method, a self-refresh mode signal is provided. The self-refresh mode signal is enabled and disabled in the self-refresh mode and the non self-refresh mode, respectively. An oscillation signal is generated, independent of the self-refresh mode signal. A self-refresh request signal is provided in response to the self-refresh mode signal and the oscillation signal. In response to the self-request signal, an address signal is provided. By the address signal, a wordline is selected for refreshing relevant memory cells of the selected wordline.

For example, the step of generating an oscillation signal includes the step of generating a free-run oscillation signal in response to a power signal. The self-refresh mode signal has "high" and "low" logic states. Similarly, the oscillation signal has "high" and "low" logic states. The self-refresh request signal is provided in response to the logic states of the self-refresh mode signal and the oscillation signal. Also, the providing of the self-refresh request signal is ceased in response to the logic states of the self-refresh mode signal and the oscillation signal.

Advantageously, the timing for providing and ceasing the self-refresh request signal is arbitrated based on the logic states in a case where the logic states of the self-refresh mode signal and the oscillation signal are "high". For example, in a case where a rising transition of the self-refresh mode signal is earlier than that of the oscillation signal, the self-refresh signal is provided in response to the following rising transition of the oscillation signal. In a case where a rising transition of the oscillation signal is earlier than that of the self-refresh mode signal, the generation of the self-refresh signal is ceased in response to the following rising transition of the oscillation signal.

In accordance with another aspect of the present invention, there is provided a self-refresh controller for use in a dynamic random access memory (DRAM) device selectively operated in a self-refresh mode and a non self-refresh mode. In the self-refresh controller, a detection circuit for provides a self-refresh mode signal in response to the refresh mode selection. An oscillation circuit produces an oscillation signal in response to a DRAM power indication signal. In response to the self-refresh request signal, an address signal is provided to refresh relevant memory cells of a wordline of the DRAM.

In accordance with embodiments of the present invention, the generation of unpredictable self-refresh request pulse of narrow width is prevented. A reliable self-refresh request signal with a wide range of cell retention time due to the support by the free-run oscillation signal is provided. Additionally, a temperature compensation circuit can be added for controlling or adjusting the self-refresh period in accordance with changes to the temperature along with the free-running oscillator.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

In the following detailed description of sample embodiments of the invention, reference is made to the accompanying drawings which form a part hereof, and in which is shown by way of illustration of specific sample embodiments in which the present invention may be practiced. These embodiments are described in sufficient detail to enable those of ordinary skill in the art to practice the present invention, and it is to be understood that other embodiments may be utilized and that logical, electrical, and other changes may be made without departing from the scope of the present invention. The following detailed description is, therefore, not to be taken in a limiting sense, and the scope of the present invention is defined by the appended claims.

Figure 1A:
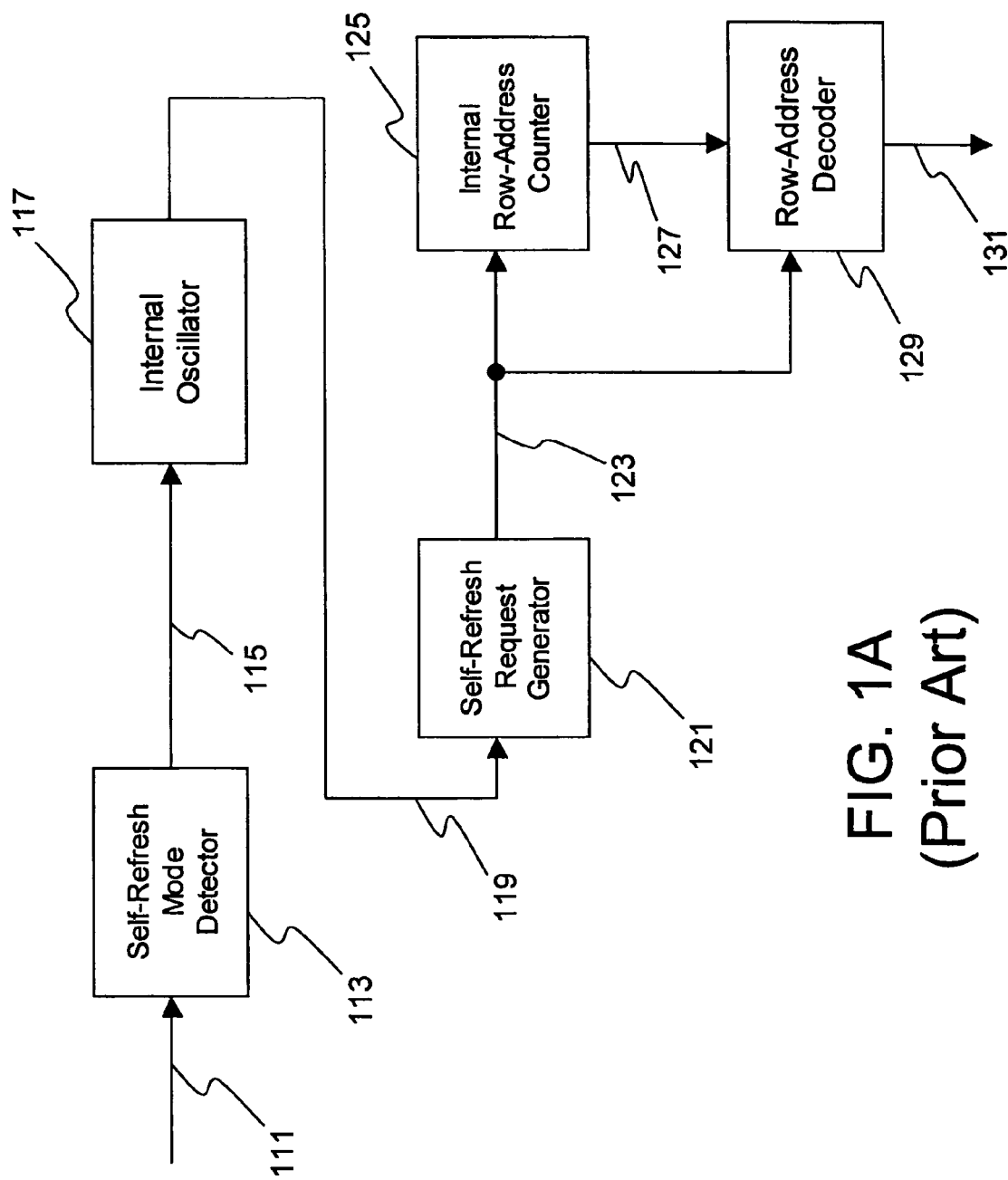
FIG. 1A illustrates a self-refresh control circuit block diagram found in conventional dynamic random access memory (DRAM) devices.
Figure 1B:
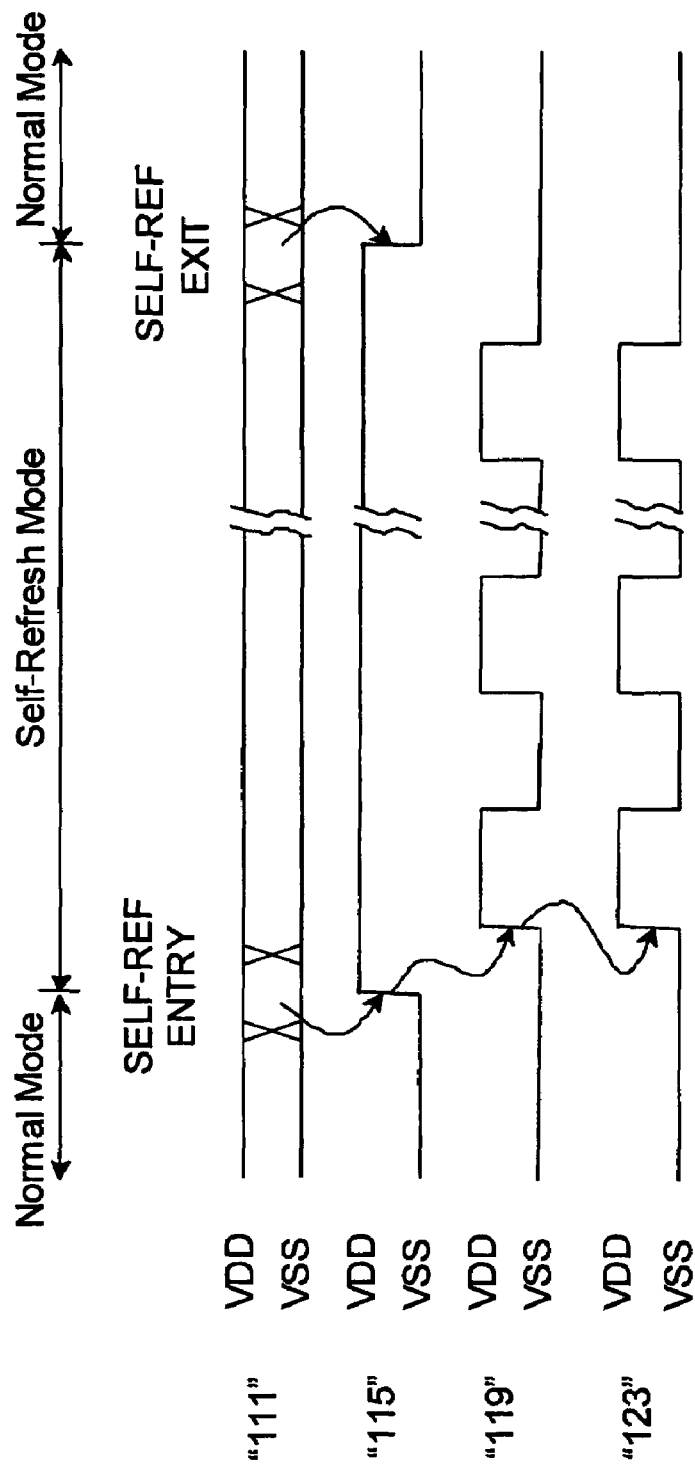
FIG. 1B illustrates a timing sequence for the signals of the DRAM device shown in FIG. 1A.

FIG. 1A shows a self-refresh controller found in conventional dynamic random access memories (DRAMs) and FIG. 1B shows the relative timing sequence for the signals of the DRAM device shown in FIG. 1A. Referring to FIGS. 1A and 1B, a "self-refresh" mode, also known as a "sleep" mode, can be activated by a command signal 111. In response to the command signal 111 having a self-refresh entry command "SELF-REF ENTRY", a self-refresh mode detector 113 enables a self-refresh mode signal 115 so as to be active "high" (i.e., "high" logic level voltage VDD). In response to the "high" self-refresh mode signal 115, an internal oscillator 117 is initiated to commence the generation of a self-refresh oscillation signal 119 having a predetermined duration and frequency. The oscillation signal 119 is combined with other signals by a self-refresh request generator 121 which in turn generates a self-refresh request oscillation signal 123. The request signal 123 enables an internal row-address counter 125 to generate a signal 127 having an appropriate internal row address. A row-address decoder 129 is controlled by the self-refresh request signal 123 and decodes the internal row address to provide a decoded address signal 131, with the result that a selected wordline is activated. When the self-refresh mode detector 113 receives a self-refresh exit command "SELF-REF EXIT" on the command signal 111, the self-refresh mode signal 115 goes "low" (i.e., "low" logic level voltage VSS) and the internal oscillator 117 is disabled, with the result that the generation of the oscillation signal 119 is ceased. Thereafter, the self-refresh request signal 123 is no longer provided to refresh the DRAM memory cells.

In conventional DRAM devices, taking into account the cell retention time, the initiation time of the internal oscillator 117 upon receipt of the self-refresh mode signal 115 is not critical for refreshing the DRAM cells properly. However, DRAM devices with high-speed operation and high-density CMOS ICs fabricated with sub-100 nm technology, for example, require a shorter initiation time for properly refreshing the DRAM cells thereof. For example, in a case of 90 nm DRAM macro process, an estimated cell retention time is 0.5 ms for refreshing 4K rows. Thus, an initiation time shorter than 125 ns (=0.5 ms/4000) is required for initiating the oscillator, which subsequently results in a proper refresh operation. However, the initiation time of conventional oscillators is between 0.5 ms and 32 ms and thus, it does not meet with the 125 ns requirement for initializing the oscillator for DRAM devices fabricated with sub-100 nm technology.

Figure 2:
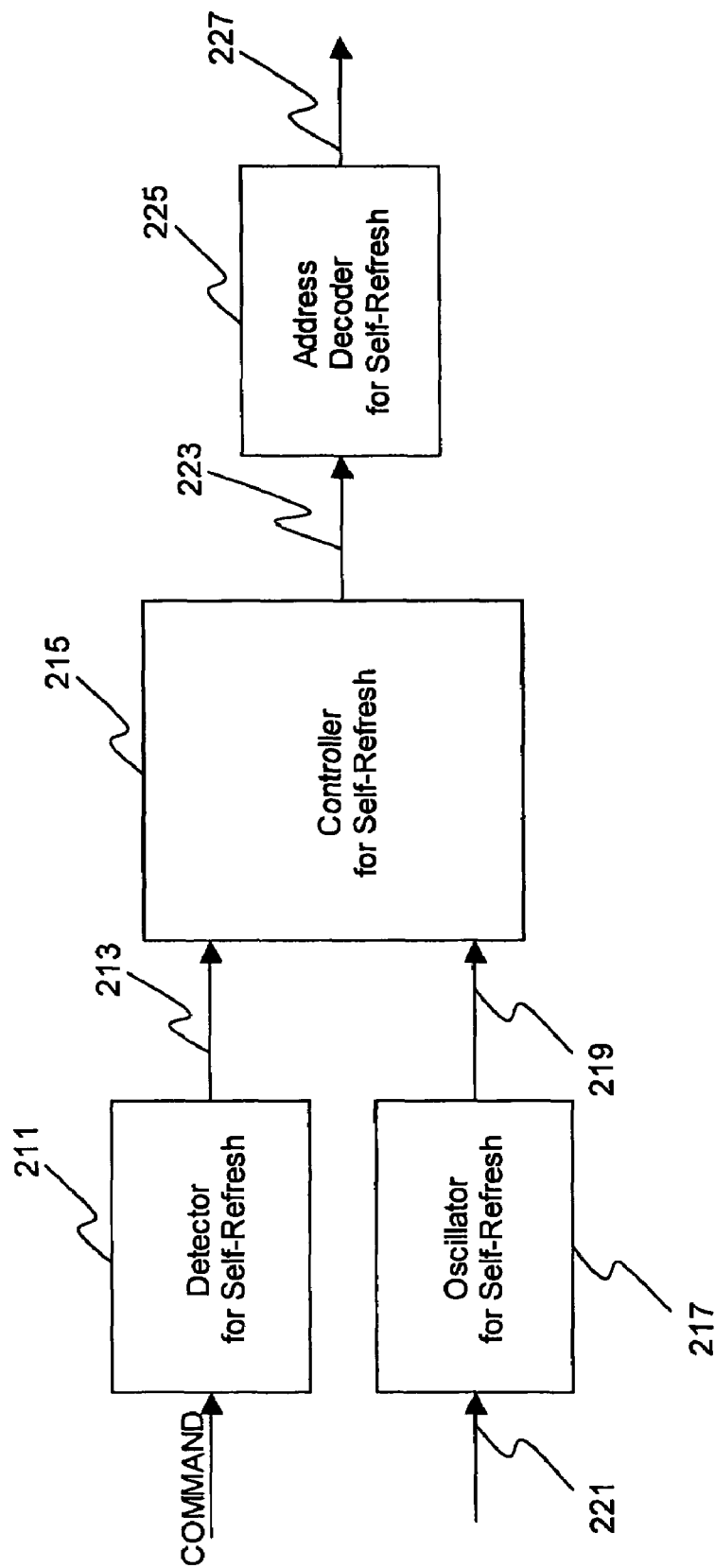
FIG. 2 is a block diagram of a DRAM device self-refresh controller in accordance with one embodiment of the present invention.

FIG. 2 illustrates the self-refresh circuit blocks of a dynamic random access memory (DRAM) device in accordance with one embodiment of the present invention. The DRAM device is selectively operated in a self-refresh mode and a normal mode (a non self-refresh mode). Referring to FIG. 2, in response to self-refresh COMMAND, a detector 211 provides a signal 213 for self-refresh to a controller 215. An oscillator 217 generates an oscillation signal 219 for self-refresh, initiated by a power-up signal 221. The oscillation signal 219 is provided to the controller 215 which in turn provides a request signal 223 for self-refresh to an address decoder 225. The address decoder 225 provides a decoded address signal 227 for self-refresh. The detector 211 enables and disables the signal 213 in response to the self-refresh mode and the non self-refresh mode by self-refresh commands, respectively. The controller 215 arbitrates when a timing conflict occurs between the pulses of the signal 213 and the oscillation signal 219.

For example, the oscillator 217 includes a free-running oscillator that is activated by a power-up signal 221, independent of the generation of the signal 213 for self-refresh. The free-running oscillator continues until it is unnecessary or the power to the DRAM device is turned off. Thus, in the DRAM device according to an embodiment of the invention, no external initiation of the oscillation for self-refreshing is necessary. Also, with the arbitration function of the controller 215, when the oscillation signal 219 goes "high" earlier than signal 213, the request signal 223 is provided in response to the subsequent transition of the oscillation signal 219. Also, when the oscillation signal 219 goes "low" later than the self-refresh signal 213, the request signal 223 is ceased in response to the subsequent falling transition of the oscillation signal 219. Thus, the controller 215 arbitrates a timing conflict between the self-refresh signal 219 and the self-refresh signal 213.

Figure 3:
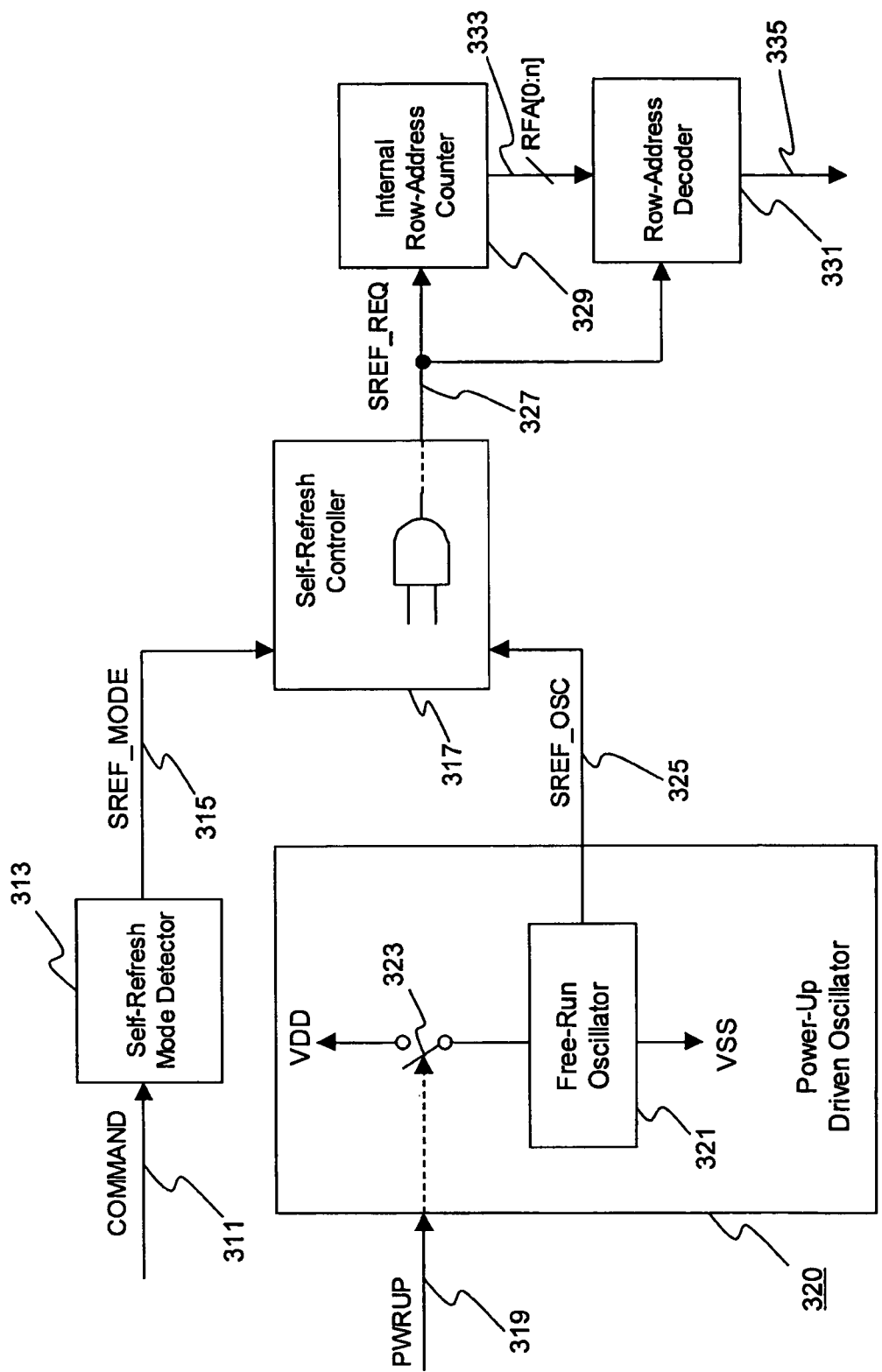
FIG. 3 is a block diagram illustrating a DRAM device self-refresh controller in accordance with an embodiment of the present invention.

FIG. 3 shows a DRAM device according to an embodiment of the present invention. The circuits of the DRAM device shown in FIG. 3 operate with high and low power supply voltages VDD and VSS that correspond to "high" and "low" logic level voltages, respectively. The DRAM device responds to a self-refresh mode and a normal mode (a non self-refresh mode).

Referring to FIG. 3, a command signal "COMMAND" 311 is fed to a self-refresh mode detector 313, which enables and disables a self-refresh mode signal "SREF_MODE" 315 at the entry into and the exit from the self-refresh mode, respectively. The self-refresh mode signal 315 is provided to a self-refresh controller 317. The self-refresh mode signal 315 transitions from the "low" logic state to the "high" logic state (i.e., a rising transition) in response to the "self-refresh entry" command and transitions from the "high" logic state to the "low" logic state (i.e., a falling transition) in response to the "self-refresh exit" command. The self-refresh controller 317 functions as a logical AND circuit.

A power-up signal "PWRUP" 319 is fed to a power-up driven oscillator 320 which in turn provides a self-refresh oscillation signal "SREF_OSC" 325 to the self-refresh controller 317. The power-up driven oscillator 320 includes a free-running oscillator 321 that generates an oscillation signal of pulses, independent of the self-refresh mode signal 315. The free-running oscillator 321 generates pulses having a predetermined period and width. The power-up signal 319 is provided when the DRAM device is turned on and sets an operation switch 323 to the "on" state, thereby connecting the free-running oscillator to VDD. Therefore, the power supply voltages corresponding to the "high" and "low" logic level voltages VDD and VSS are supplied to the free-running oscillator 321 to be activated to commence oscillation. The free-running oscillator 321 continues operating until the switch 323 is turned off with lack of the power-up signal 319 when the power to the DRAM device is turned off or the DRAM device enters the "deep power down mode", wherein no data of the DRAM cells is required to be refreshed.

In response to the self-refresh mode signal 315 and the self-refresh oscillation signal 325, the self-refresh controller 317 enables and disables a self-refresh request oscillation signal "SREF_REQ" 327 that is provided to an internal row-address counter 329 and a row-address decoder 331. The internal row-address counter 329 provides an internal row address signal 333, RFA[0:n], to the row-address decoder 331 that decodes it to provide a decoded address signal 335, with the result that a selected wordline (not shown) is activated. Memory cells of the DRAM device connected to the activated wordline are refreshed. The free-running oscillator 321 commences its oscillation independently of the self-refresh mode entry, and its oscillation is free-running and thus, the generation of the self-refresh request oscillation signal 327 is not properly synchronized with the self-refresh mode signal 315. Essentially, the transition of the SREF_MODE signal 315 has no interrelation with the SREF_OSC signal 325. This can result in undesired pulses in the SREF_REQ signal under certain situations as will be discussed in further detail below. It is, however, noted that in the embodiment shown in FIG. 3, the time required to generate self-refresh address signals is less than in the conventional approach illustrated in FIG. 1A, since the power-up driven free-running oscillator 320 of FIG. 3 ensures there is an oscillation signal available to generate self-refresh address signals as soon as the integrated circuit has been powered-up as opposed to waiting until a self-refresh command signal is received.

Figure 4A:
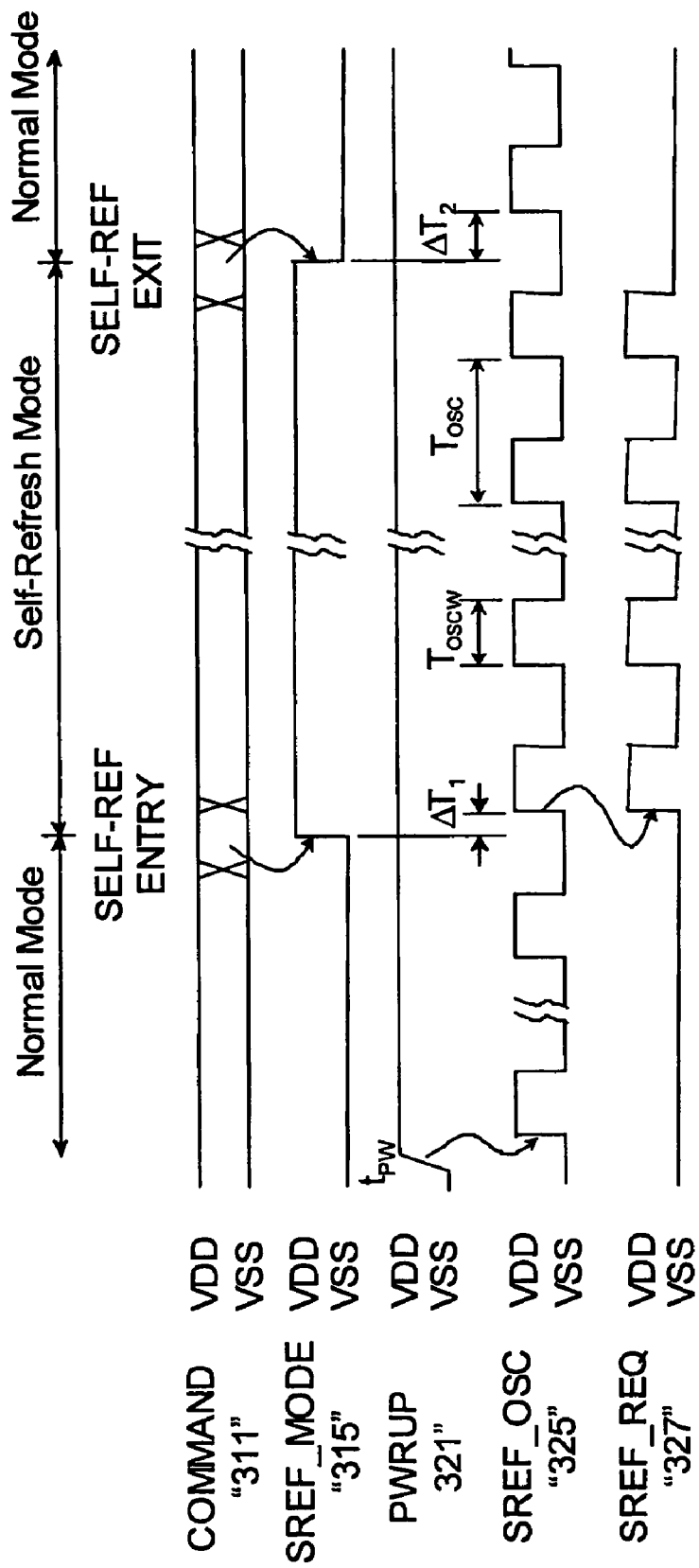
FIG. 4A is a timing sequence for the signals of the DRAM device shown in FIG. 3 operated with non-overlap between a self-refresh mode signal and a self-refresh oscillation signal at an entry into and an exit from a self-refresh mode.

FIG. 4A shows a relative time sequence for the signals of the DRAM device shown in FIG. 3. Referring to FIGS. 3 and 4A, the power-up driven oscillator 320 (the free-running oscillator 321) is initiated as soon as the DRAM device is turned on (powered-up) in response to the power-up signal 319, at time $t_{PW}$. Thereafter, the self-refresh oscillation signal 325 is continuously provided as an input to the self-refresh controller 317, regardless of the logic state of the self-refresh mode signal 315. The oscillation signal 325 is an oscillation signal having a predetermined and fixed pulse period $T_{OSC}$ without temperature compensation and a predetermined and fixed pulse width $T_{OSCW}$. The pulse period $T_{OSC}$ is fixed at a time of power-up by a memory controller (not shown), for example.

The generation of the self-refresh request oscillation signal 327 is controlled by both the self-refresh mode signal 315 and the self-refresh oscillation signal 325 to produce the self-refresh request signal 327 for the internal row-address counter 329 and the row-address decoder 331. As the self-refresh controller 317 according to the embodiment shown in FIG. 3 functions as a logical AND circuit, the pulses of the self-refresh oscillation signal 325 are gated during the "high" logic state of the self-refresh mode signal 315. However, the self-refresh oscillation signal 325 is not properly synchronized with the self-refresh mode signal 315 and thus, the self-refresh request signal 327 may have unpredictable pulse widths at the entry into and the exit from the self-refresh mode. Narrow pulses are therefore possibly active for an insufficient time, causing malfunction of row address decoding. As a result, the desired wordlines may not be activated and data will be lost. Malfunctions caused from the production of such narrow pulses will be described later with reference to FIG. 4B.

With regard to the pulse timing of the self-refresh request oscillation signal, there are two possible situations between the self-refresh mode signal 315 and the self-refresh oscillation signal 325. One situation is that the logic state transition (a rising transition from the "low" to "high" logic state and/or a falling transition from the "high" to "low" logic state) of the self-refresh mode signal 315 does not occur during the "high" logic state of the self-refresh oscillation signal 325. This is called a "non-overlap condition". The other situation is a critical situation wherein the logic state transition (a rising transition from the "low" to "high" logic state and/or a falling transition from the "high" to "low" logic state) of the self-refresh mode signal 315 occurs during the "high" logic state of the self-refresh oscillation signal 325. This is called an "overlap condition".

A discussion of the non-overlap condition follows. The self-refresh mode signal 315 does not change its logic transition during the "high" logic state of the self-refresh oscillation signal 325. In this situation, as shown in FIG. 4A, the "low" to "high" logic state transition of the self-refresh mode signal 315 is earlier than that of the self-refresh oscillation signal 325 by a time interval (a setup time) $\Delta T_1$. Also, the "high" to "low" logic state transition (i.e., a falling transition) of the self-refresh mode signal 315 is earlier than the "high" to "low" logic state transition of the self-refresh oscillation signal 325 by a time interval $\Delta T_2$. In this case, the pulses of the self-refresh oscillation signal 325 are gated by the self-refresh controller 317 that functions as a logical AND circuit. Therefore, the self-refresh controller 317 provides the self-refresh request oscillation signal 327, which directly corresponds to the self-refresh oscillation signal 325 only while the self-refresh mode signal 315 is at the "high" logic state. Thus, the providing and ceasing of the self-refresh request oscillation signal 327 is controlled by and tracks the self-refresh mode signal 315 with only small delays $\Delta T_1$ and $\Delta T_2$ as explained above.

Figure 4B:
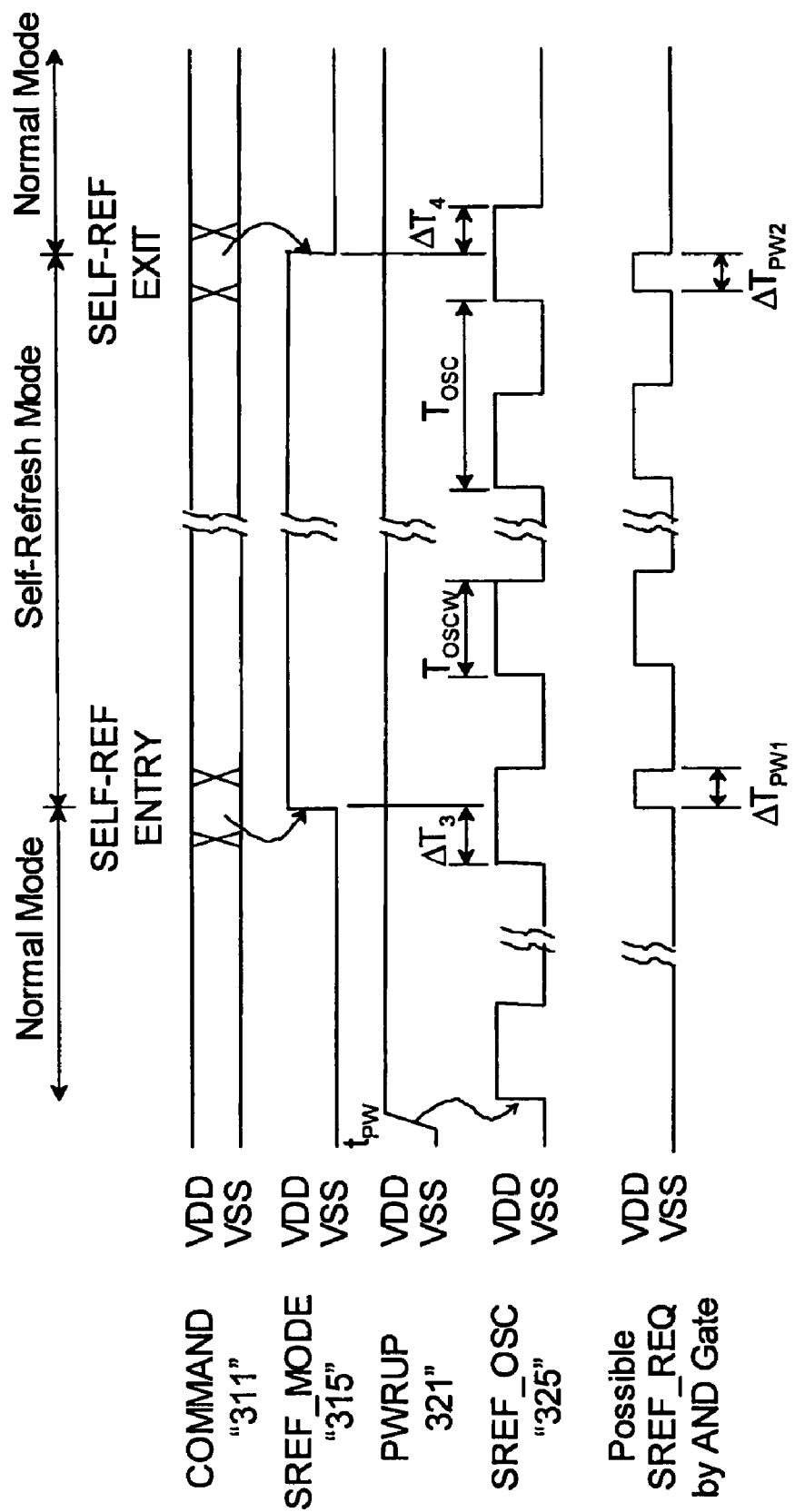
FIG. 4B is a timing sequence for the signals of the DRAM device shown in FIG. 3 operated with overlap between the self-refresh mode signal and the self-refresh oscillation signal at the entry into and the exit from a self-refresh mode.

FIG. 4B shows a relative time sequence for the signals of the DRAM device in the overlap condition wherein the self-refresh mode signal 315 changes its logic state during the "high" logic state of the self-refresh oscillation signal 325. Referring to FIGS. 4B and 3, the self-refresh oscillation signal 325 goes "high" a time interval $\Delta T_3$ before the rising transition of the self-refresh mode signal 315. Also, the self-refresh oscillation signal 325 goes "low" a time interval $\Delta T_4$ after the falling transition of the self-refresh mode signal 315. If the self-refresh controller 317 functions as a logical AND circuit, it will produce the self-refresh request oscillation signal 327 having pulses of widths $\Delta T_{PW1}$ and $\Delta T_{PW2}$ at the beginning and ending (i.e., the entry into and the exit from) of the self-refresh mode, as shown in FIG. 4B. The pulse widths $\Delta T_{PW1}$ and $\Delta T_{PW2}$ are narrower than the pulse width $T_{OSCW}$ of the oscillation signal 325. Such narrower pulse widths of the self-refresh request signal 327 may cause a malfunction of row address decoding by the row-address decoder 331. This can result in the wordlines being activated for a duration insufficient for restoring the data levels. Such malfunction problems possibly caused from the "overlap condition" at a critical situation can be solved by implementing a timing arbitration circuit into the self-refresh controller 317 as shown in FIG. 5.

Figure 5:
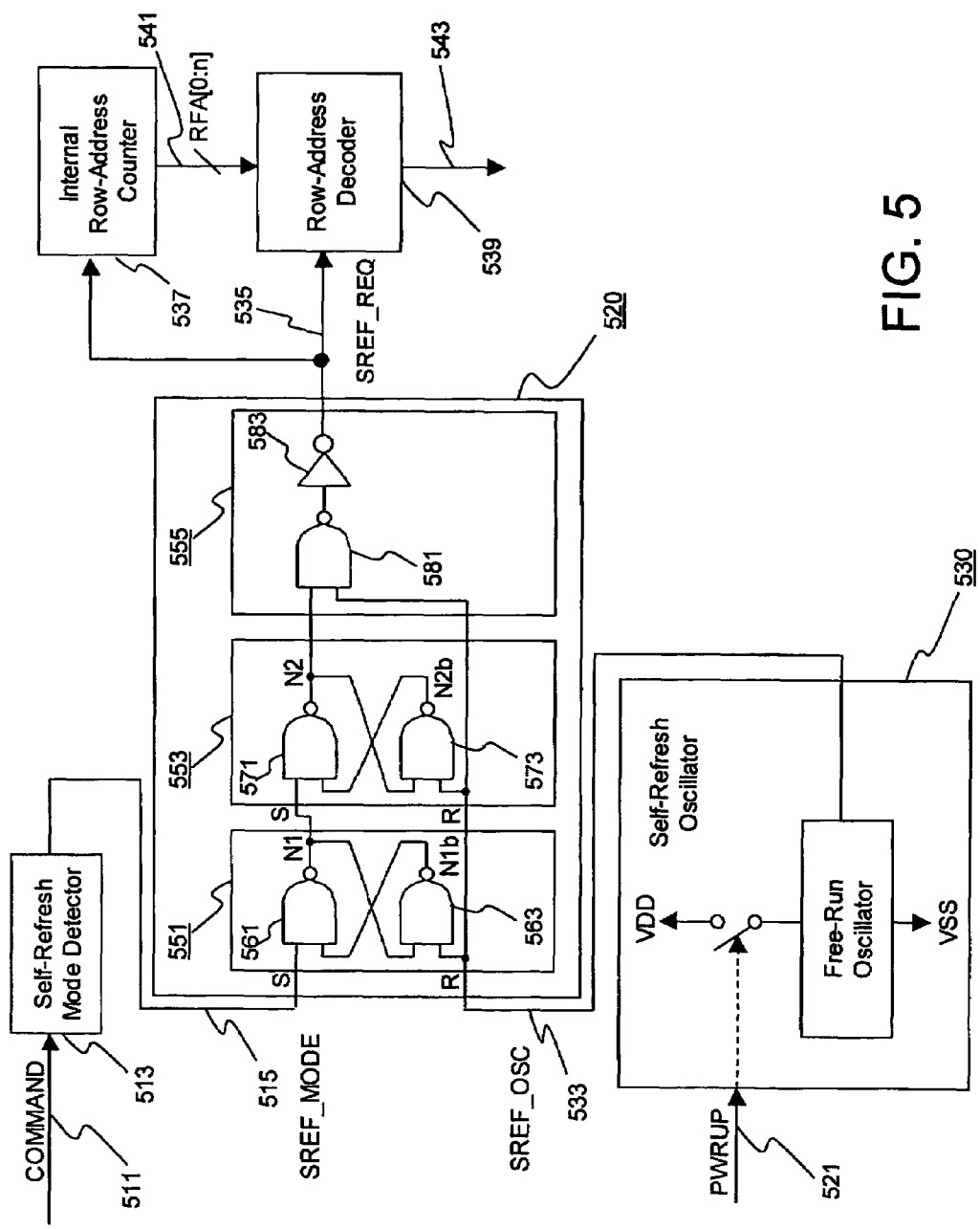
FIG. 5 is a block diagram illustrating a DRAM device self-refresh controller in accordance with another embodiment of the present invention.

FIG. 5 shows a DRAM device in accordance with another embodiment of the present invention. The DRAM device shown in FIG. 5 solves the problems with critical situations described above. Thus, a self-refresh controller shown in FIG. 5 is different from that of FIG. 3, and the others are similar to those of FIG. 3.

Referring to FIG. 5, a command signal "COMMAND" 511 is fed to a self-refresh mode detector 513 which in turn provides a self-refresh mode signal "SREF_MODE" 515 to a self-refresh controller 520. A power-up signal "PWRUP" 521 is fed to a self-refresh oscillator 530 which in turn provides a self-refresh oscillation signal "SREF_OSC" 533 to the self-refresh controller 520. The structure of the self-refresh oscillator 530 is the same as the power-up driven oscillator 320 shown in FIG. 3 and it includes a free-running oscillator that generates an oscillation signal. The self-refresh oscillator 530 is activated by the power-up signal 521 when the DRAM device is turned on. In response to the self-refresh mode signal 515 and the self-refresh oscillation signal 533, the self-refresh controller 520 provides a self-refresh request oscillation signal "SREF_REQ" 535 to an internal row-address counter 537. The self-refresh request oscillation signal "SREF_REQ" 535 is provided to a row-address decoder 539 also for consideration of timing delays of signals. The internal row-address counter 537 provides an internal row address signal 541, RFA[0:n], to the row-address decoder 539 that decodes it to provide a decoded address signal 543, with the result that a selected wordline (not shown) is activated. Memory cells of the DRAM device connected to the activated wordline are refreshed.

The self-refresh controller 520 is similar to the self-refresh controller 317 shown in FIG. 3, but functions as an arbitration circuit. Referring to FIG. 5, the self-refresh controller 520 includes logic circuitry having cascaded first and second RS-type latches 551 and 553 and an AND circuit 555 for arbitrating critical timing conditions. Each of the first and second RS-latches 551 and 553 includes cross-coupled, two-input NAND gates to form a flip-flop having set and reset input terminals "S" and "R". The self-refresh mode signal 515 and the self-refresh oscillation signal 533 are fed to the first RS-latch 551, which includes two NAND gates 561 and 563. An output signal "N1" of the RS-latch 551 (i.e., the output of the NAND gate 561) and the self-refresh oscillation signal 533 are fed to the second RS-latch 553 which includes two NAND gates 571 and 573. An output signal "N2" of the RS-latch 553 (i.e., the output of the NAND gate 571) and the self-refresh oscillation signal 533 are fed to the AND circuit 555 including a NAND gate 581 and an inverter 583. The output logic signal of the NAND gate 581 is inverted by the inverter 583 to provide the self-refresh request oscillation signal 535. The circuits of the DRAM device shown in FIG. 5 operate with high and low power supply voltages VDD and VSS that correspond to "high" and "low" logic level voltages, respectively.

Figure 6:
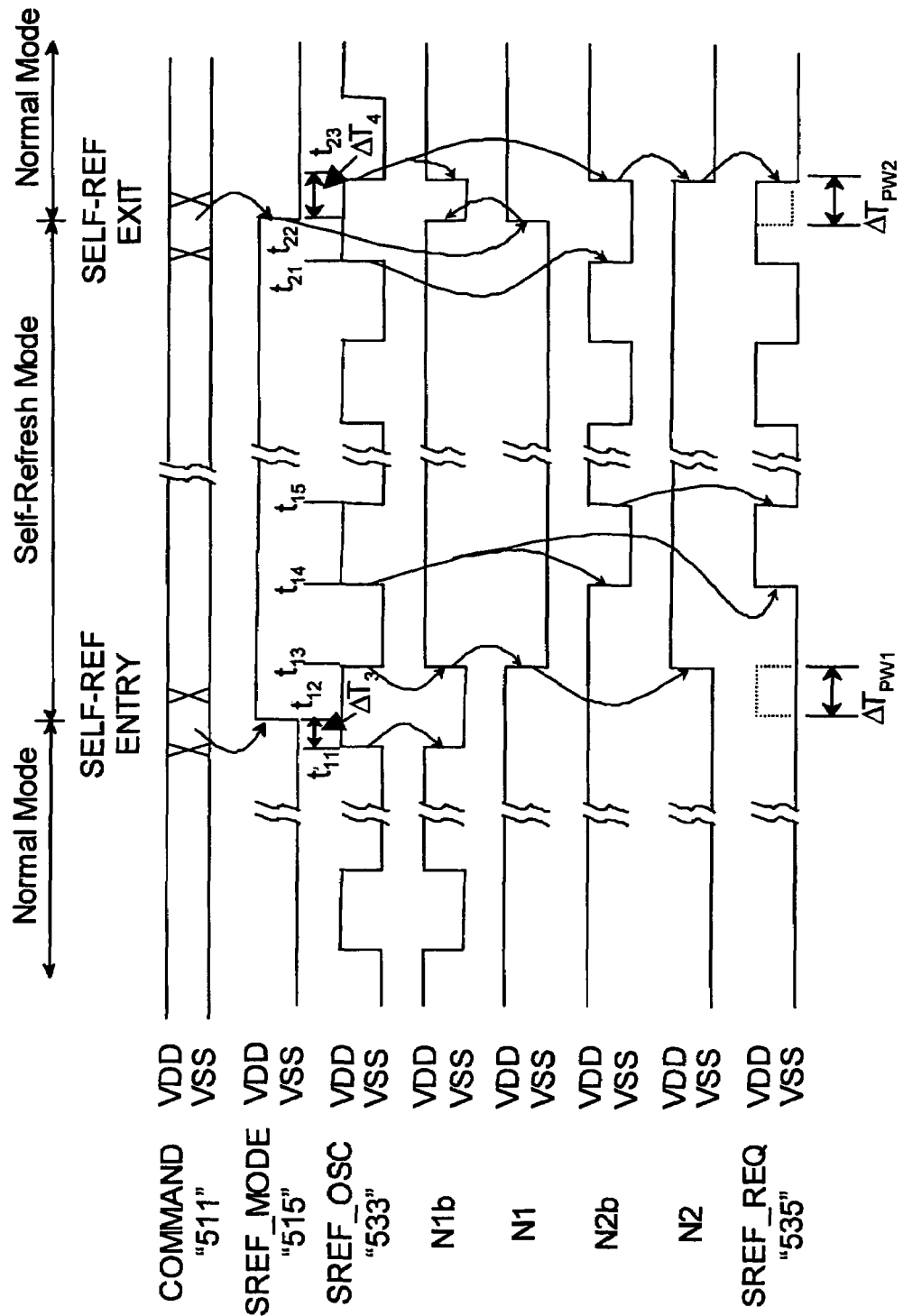
FIG. 6 is a timing sequence for the signals of the DRAM device shown in FIG. 5 operated with overlap between the self-refresh mode signal and the self-refresh oscillation signal at the entry into and the exit from a self-refresh mode.

FIG. 6 shows a relative timing sequence for the signals shown in FIG. 5 in the overlap condition of the self-refresh mode signal and the oscillator signal. As shown in FIG. 6, at the self-refresh entry, if the rising transition of the self-refresh mode signal 515 occurs during the period of the "high" logic state of the self-refresh oscillation signal 533, the self-refresh request oscillation signal 535 will not be generated for the overlap condition, so as to avoid generating narrow pulse $\Delta T_{PW1}$ (see FIG. 4B). Such a narrow pulse causes an insufficient cell restore level. Similarly, at the self-refresh exit, if the falling transition of the self-refresh mode signal 511 occurs during the "high" logic state of the self-refresh oscillation signal 533, the self-refresh request oscillation signal 535 will not be ceased for the overlap condition, so as to avoid generating narrow pulse $\Delta T_{PW2}$ (see FIG. 4B). Such a narrow pulse may not be enough to finish cell restoration with the proper cell charge level.

With the self-refresh entry, the self-refresh mode signal 515 transitions from the "low" logic state to the "high" logic state at time $t_{12}$. At time $t_{11}$ (the time interval $\Delta T_3$ before time $t_{12}$), the self-refresh oscillation signal 533 transitions from the "low" logic state to the "high" logic state. In response to the falling transition of the self-refresh oscillation signal 533 at time $t_{13}$ (the width $\Delta T_{PW1}$ after time $t_{12}$), the NAND gates 561 and 563 of the RS-latch 551 change their logic states and the output N2 of the NAND gate 571 of the RS-latch 563 changes its logic state from "low" to "high". However, as the logic state of the self-refresh oscillation signal 533 is "low", the AND circuit 555 (the inverter 583) does not change its output logic state. At time $t_{14}$ (the pulse period $T_{OSC}$ after time $t_{11}$), in response to the rising transition of the self-refresh oscillation signal 533, the AND circuit 555 changes its output logic state from "low" to "high". In response to the next falling transition of the self-refresh oscillation signal 533 at time $t_{15}$ (the pulse width $\Delta T_{OSCW}$ after time $t_{14}$), the output of the AND circuit 555 goes "low". Accordingly, the first pulse is provided as the self-refresh request oscillation signal 535. Thus, the first overlapped "high" logic states between the self-refresh oscillation signal 533 and the self-refresh mode signal 515 does not cause the self-refresh request oscillation signal 535 to be generated. The subsequent rising transition of the self-refresh oscillation signal 533 at time $t_{14}$ causes the generation of the self-refresh request oscillation signal 535. Hence, the RS-latches 551 and 553 detect the "overlapped" rising transition at time $t_{12}$ and hold the generation of the pulse of the self-refresh request oscillation signal 535 until the subsequent rising transition of the self-refresh oscillation signal 533.

With the self-refresh exit, the self-refresh mode signal 515 transitions from the "high" logic state to the "low" logic state at time $t_{22}$. After time $t_{21}$ but before time $t_{22}$, the output of the RS-latch 553 (the output N2 of the NAND gate 571) is the "high" logic state. In response to the rising transition of the self-refresh oscillation signal 533, the output of the AND circuit 555 transitions from the "low" logic state to the "high" logic state. At time $t_{22}$, the logic state of the self-refresh mode signal 515 transitions from the "high" to "low" state, and the output N1 of the NAND gate 561 transitions from the "low" logic state to the "high" logic state. However, the output N2b of the NAND gate 573 keeps its "low" logic state, with the result that the output N2 of the NAND gate 571 does not change its logic state ("high"). Thus, the AND circuit 555 (the self-refresh controller 520) maintains its "high" logic state. Thereafter, the self-refresh oscillator signal 533 transitions from the "high" logic state to the "low" logic state at time $t_{23}$ (the time interval $\Delta T_4$ after time $t_{22}$). Then, the output N2 of the NAND gate 571 changes its logic state from "high" to "low", with the result that the output of the AND circuit 555 (the output of the self-refresh controller 520) goes "low". Thereafter, the output N2 of the RS-latch 553 maintains its "low" logic state and thus, while the self-refresh oscillation signal 533 transitions from the "low" logic state to the "high" logic state, the self-refresh controller 520 maintains its "low" logic state. Accordingly, the last pulse is provided as the self-refresh request oscillation signal 535. Thus, the last overlapped "high" logic states between the self-refresh oscillation signal 533 and the self-refresh mode signal 515 does not cause the self-refresh request oscillation signal 535 to be ceased. The subsequent falling transition of the self-refresh oscillation signal 533 at time $t_{23}$ ceases the generation of the self-refresh request oscillation signal 535. Hence, the RS-latches 551 and 553 detect the "overlapped" falling transition at time $t_{22}$ and hold the ceasing of the pulse of the self-refresh request oscillation signal 535 until the subsequent falling transition of the self-refresh oscillation signal 533.

Figure 7:
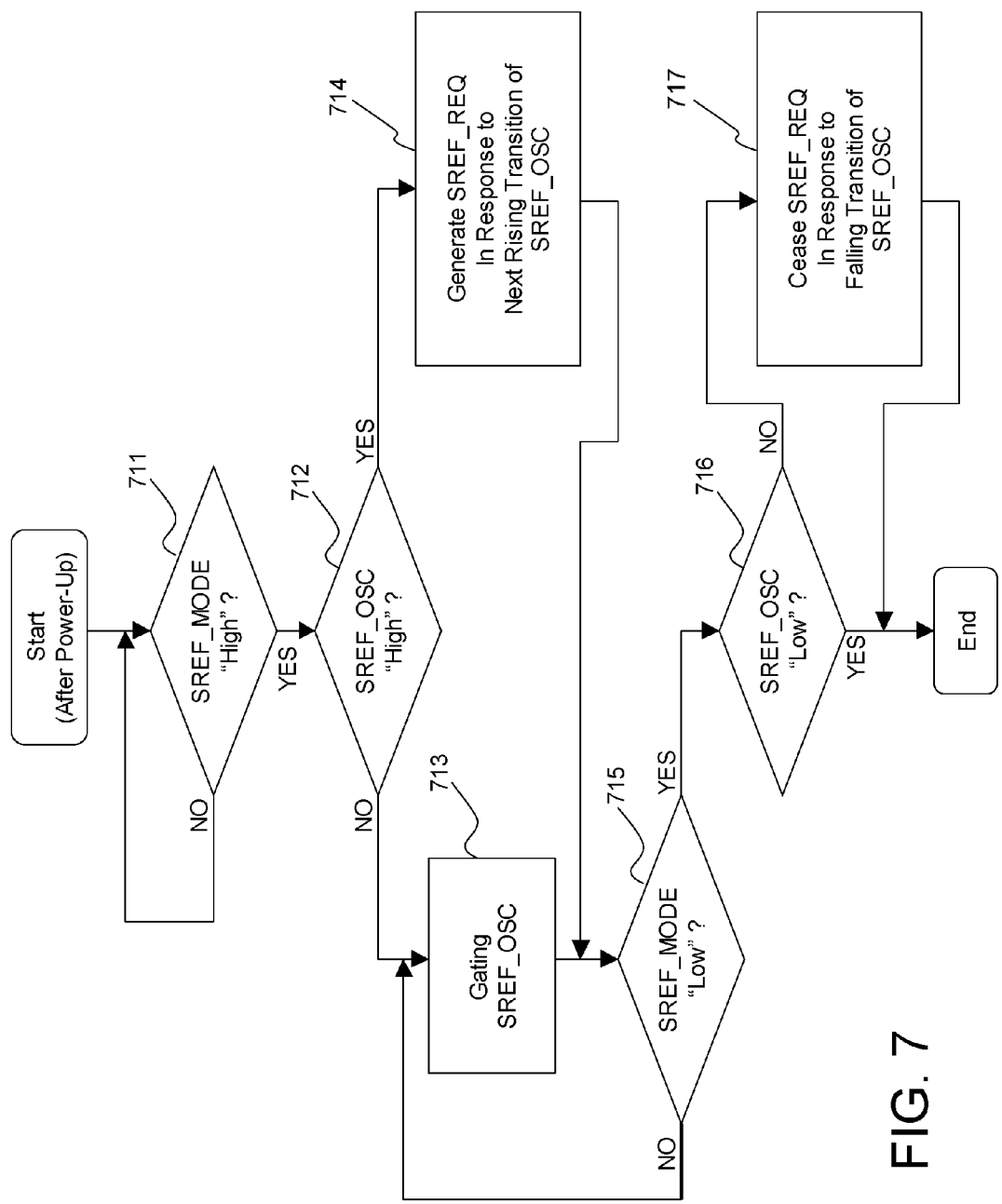
FIG. 7 is a flowchart illustrating the arbitration operation of a self-refresh request generator included in the DRAM device shown in FIG. 5.

FIG. 7 shows the arbitration operation performed by the self-refresh controller 520 shown in FIG. 5. Referring to FIGS. 5, 6 and 7, in response to the power-up signal 521, the self-refresh oscillator 530 commences its free-run oscillation and the self-refresh oscillation signal 533 is continuously generated. The arbitration operation is performed based on relative timing of the self-refresh mode signal 515 and the self-refresh oscillation signal 533.

The self-refresh controller 520 determines whether the logic state of the self-refresh mode signal 515 for the self-refresh entry (step 711) is "high". In a case where the logic state is "low" (NO), this step is repeated. If the logic state becomes "high" (YES), that is for self-refresh entry (see the operation at time $t_{11}$ in FIG. 6), subsequently the self-refresh controller 520 will determine the logic state of the self-refresh oscillation signal 533 (step 712). In a case where the logic state is "low" (NO), the timing relation between the self-refresh mode signal 515 and the self-refresh oscillation signal 533 is the "non-overlap condition" and it is not a critical situation for self-refresh mode entry. Thus, the self-refresh oscillation signal 533 is gated based on the self-refresh mode signal 515 (step 713) and the self-refresh request oscillation signal 535 is produced (see the self-refresh request oscillation signal 327 shown in FIG. 4A).

On the other hand, in a case where the logic state of the self-refresh oscillation signal 533 is "high" (YES at step 712), the timing relation between the self-refresh mode signal 515 and the self-refresh oscillation signal 533 is in the "overlap condition". This is a critical situation for self-refresh mode entry. In response to the subsequent rising transition of the self-refresh oscillation signal 533, the self-refresh request oscillation signal 535 is produced (step 714) (see the operation between times $t_{11}$-$t_{14}$ shown in FIG. 6).

After the self-refresh request oscillation signal 535 is produced (step 713 or 714), the logic state of the self-refresh mode signal 515 is again determined for the self-refresh exit (step 715). In a case where the logic state is "high" (NO), the gating of the self-refresh oscillation signal 533 based on the self-refresh mode signal 515 is repeated (step 713). If the logic state becomes "low" (YES) (see the operation at time $t_{22}$ in FIG. 6), for self-refresh exit, subsequently the self-refresh controller 520 will determine the logic state of the self-refresh oscillation signal 533 (step 716). In a case where the logic state is "low" (YES), the timing condition of the self-refresh mode signal 515 and the self-refresh oscillation signal 533 is in the "non-overlap condition" and it is not a critical situation for self-refresh mode exit. The generation of the self-refresh request oscillation signal 535 ends without generation of any more pulses of the self-refresh request oscillation signal 535 (see the self-refresh request oscillation signal 327 shown in FIG. 4A).

On the other hand, in a case where the logic state of the self-refresh oscillation signal 533 is "high" (NO at step 716), the timing condition of the self-refresh mode signal 515 and the self-refresh oscillation signal 533 is in the "overlap condition", being a critical situation. The subsequent falling transition of the self-refresh oscillation signal 533 ceases the generation of the pulses of the self-refresh request oscillation signal 535 (step 717) (see the operation between times $t_{21}$-$t_{23}$ shown in FIG. 6).

The self-refresh controller 520 includes an arbitration circuit for detecting a critical timing situation that may create output signals of variable pulse width, and waiting for a more suitable timing situation that will ensure no variability in pulse widths before generating the appropriate signal. With the two RS-latches 551 and 553 of the arbitration circuit, while the "high" logic state of the self-refresh oscillation signal 533 is overlapped with that of the self-refresh mode signal 511 at the self-refresh entry and/or the self-refresh exit, the overlapped pulses of the self-refresh oscillation signal 533 are not transferred as the self-refresh request oscillation signal 535. Therefore, pulses having widths that are too narrow (e.g., pulse widths $\Delta T_{PW1}$ and $\Delta T_{PW2}$ as shown by dot lines in FIG. 6) are not provided as the resulting self-refresh request oscillation signal 535 at the beginning (entry) of the self-refresh mode and/or at the end (exit) of the self-refresh mode.

The DRAM device according to the embodiment of the present invention as described above allows a free-running oscillation for self-refresh thereof. Hence, the DRAM cells are effectively self-refreshed, while the oscillator's initiation time and the cell retention time are given by:

$$T_{SREF} > t_{REF}/N_{ROW} \tag{1}$$

where:

$T_{SREF}$ is the initiation time of the oscillator;
$T_{REF}$ is the DRAM cell retention time; and
$N_{ROW}$ is the number of rows of the DRAM device.

Furthermore, in critical "overlapping" conditions between the pulses of the free-running oscillation and self-refresh mode signal, the DRAM device according to an embodiment of the present invention performs the functions for detecting the overlap of the "high" logic states and for holding the held overlapped logic state. Therefore, the oscillator is independently operated after power-up and the internal self-refresh request signal is properly provided by gating and buffering the logic state transitions in overlap conditions, where the logic state transitions are mainly used for the purpose of the DRAM cell refresh operation. For example, with sub-100 nm technology feature size, future DRAM devices or macros may have a wide range of refresh characteristics because of minimally sized transistors, temperature variation, voltage variation and process variation. It is possible for the DRAM device according to the embodiment of the present invention that the cells are self-refreshed regardless of timing of the self-refresh entry and exit.

Figure 8:
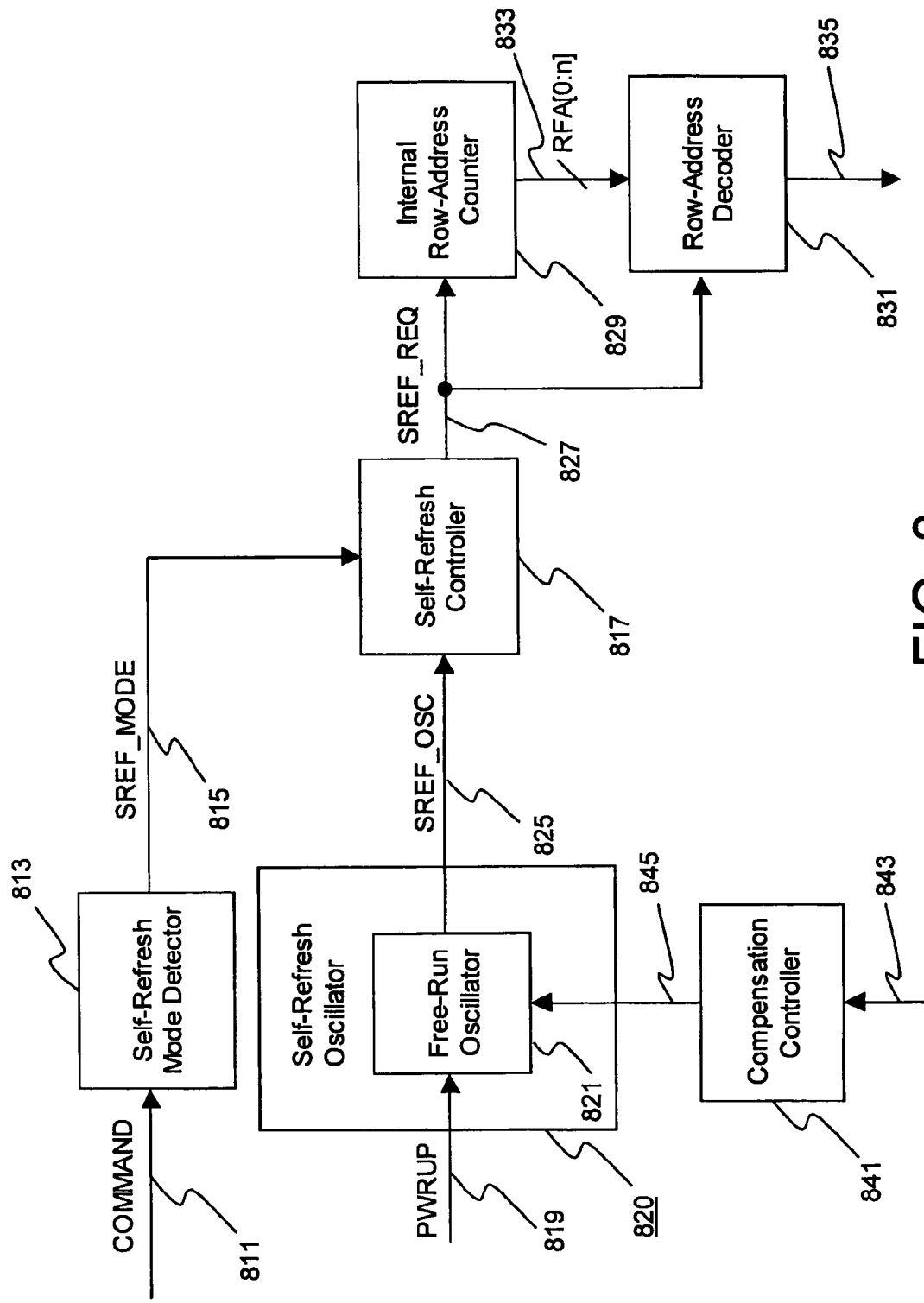
FIG. 8 is a block diagram illustrating a DRAM device self-refresh controller in accordance with an embodiment of the present invention.

FIG. 8 shows a DRAM device according to another embodiment of the present invention. Referring to FIG. 8, a command signal "COMMAND" 811 is fed to a self-refresh mode detector 813, which in turn provides a self-refresh mode signal "SREF_MODE" 815 to a self-refresh controller 817. A power-up signal "PWRUP" 819 is fed to a self-refresh oscillator 820 which in turn provides a self-refresh oscillation signal "SREF_OSC" 825 to the self-refresh controller 817. The self-refresh oscillator 820 includes a free-running oscillator 821 that generates an oscillation signal to produce the self-refresh oscillation signal 825. The self-refresh oscillator 820 is activated by the power-up signal 819 when the DRAM device is turned on. In response to the self-refresh mode signal 815 and the self-refresh oscillation signal 825, the self-refresh controller 817 provides a self-refresh request signal "SREF_REQ" 827 to an internal row-address counter 829. In this embodiment, the self-refresh request signal SREF_REQ" 827 is also provided to a row-address decoder 831 for consideration of timing delays of signals. The internal row-address counter 829 provides an internal row address signal 833, RFA[0:n], to the row-address decoder 831 that decodes it to provide a decoded address signal 835, with the result that a selected wordline (not shown) is activated.

The DRAM device shown in FIG. 8 is based on the DRAM device shown in FIG. 5, with additional features. Referring to FIG. 8, added is a compensation controller 841 that receives a compensation signal 843. The compensation controller 841 provides a control signal 845 to the self-refresh oscillator 820 to adjust the oscillation pulse period $T_{OSC}$ to cover a wide range of DRAM cell retention time varied by the transistor process, power supply level, temperature, etc.

If the compensation signal 843 includes information on a change to the device temperature, the compensation controller 841 provides the control signal 845 including a control value of the temperature change. The free-running oscillator 821 adjusts or varies the pulse period $T_{OSC}$ or both the pulse period $T_{OSC}$ and the pulse width $T_{OSCW}$. In accordance with the device temperature, the self-refresh cycle (which directly relates to the pulse period $T_{OSC}$) or both the self-refresh cycle and the self-refresh time interval (which directly relates to the pulse width $T_{OSCW}$) are variably controlled ("temperature control self-refresh (TCSR)"). The self-refresh cycle can thus be varied to be longer when the device temperature drops below nominal, and varied to be shorter when the device temperature increases above nominal, due to the dependence of current leakage on temperature of the device.

Similarly, if the control information of the compensation signal 843 is a change to the power supply voltage (e.g., the "high" level voltage VDD), with control by the compensation controller 841, the self-refresh cycle or both the self-refresh cycle and the self-refresh time interval are variably controlled. Furthermore, another type of control information can be provided on the compensation signal 843 by a memory controller (not shown) to variably control the self-refresh. Therefore, it is possible for the DRAM device according to the embodiment of the present invention that the cells are self-refreshed over a wide range of cell retention time.

In the above-described embodiments, the operation has been described based on the active "high" signals for the purpose of simplicity. The circuits may be designed to perform the operation based on the "low" active signals, in accordance with a design preference. The self-refresh oscillator may further include a frequency divider for performing frequency down of the oscillation signal from the free-running oscillator. In a case of temperature control compensation for the self-refresh circuits shown in FIG. 8, the control signal from the compensation controller can change or adjust both or either of the oscillation frequency and the frequency division ratio, so as to variably control the self-refresh. The self-refresh request oscillation signal "SREF_REQ" can be provided to the internal row-address counter without providing it to the row-address decoder.

In the embodiments described above, the device elements and circuits are connected to each other as shown in the figures, for the sake of simplicity. In practical applications of the present invention to DRAM devices and semiconductor ICs, circuits, elements, devices, etc. may be connected directly to each other. As well, circuits, elements, devices, etc. may be connected indirectly to each other through other circuits, elements, devices, etc., necessary for operation of the DRAM devices and semiconductor ICs. Thus, in actual configuration of DRAM devices and semiconductor ICs, the circuit, elements, devices, etc. are coupled with (directly or indirectly connected to) each other.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A dynamic random access memory (DRAM) device selectively operated in a self-refresh mode and a non self-refresh mode, the DRAM device comprising:
a detection circuit for providing a self-refresh mode signal in response to the refresh mode selection;
an oscillation circuit for producing an oscillation signal in response to a DRAM power indication signal;
a self-refresh request circuit for providing a self-refresh request signal in response to the self-refresh mode signal and the oscillation signal; and
a refresh address circuit for providing a refresh address of DRAM cells to be refreshed in response to the self-refresh request signal.

2. The DRAM device of claim 1, wherein the oscillation circuit comprises:
a free-running oscillator for generating the oscillation signal, the free-running oscillator commencing the generation of the oscillation signal in response to a power signal.

3. The DRAM device of claim 2, wherein:
the detection circuit enables and disables the self-refresh mode signal in response to an entry into the self-refresh mode and an exit therefrom, respectively,
the self-refresh request circuit enables and disables the self-refresh request signal in response to the entry into and the exit from the self-refresh mode, respectively.

4. The DRAM device of claim 3, wherein:
the detection circuit enables the self-refresh mode signal be in "high" and "low" logic states, in response to the self-refresh mode and the non self-refresh mode, respectively.

5. The DRAM device of claim 4, wherein:
the oscillation circuit produces a pulse signal having "high" and "low" logic states as the oscillation signal, the logic state transitions of the oscillation signal occurring independent of the logic states of the self-refresh mode signal.

6. The DRAM device of claim 5, wherein the self-refresh request circuit comprises:
a logic circuit for logically combining the self-refresh mode signal and the oscillation signal to provide a logically combined output signal as the self-refresh request signal.

7. The DRAM device of claim 6, wherein:
the logic circuit provides the self-refresh request signal in response to the transition from the "low" logic state to the "high" logic state of the oscillation signal, when the logic state of the self-refresh mode signal is "high".

8. The DRAM device of claim 7, wherein:
the logic circuit ceases the providing the self-refresh request signal, when the logic state of the self-refresh mode signal is "low".

9. The DRAM device of claim 6, wherein the logic circuit comprises:
an arbitration circuit for arbitrating a signal timing conflict between the self-refresh mode signal and the oscillation signal, when the "high" logic states of the self-refresh mode signal and the oscillation signal are overlapped.

10. The DRAM device of claim 9, wherein:
when the "high" logic states of the self-refresh mode signal and the oscillation signal are overlapped, the logic circuit provides the self-refresh request signal, in response to a subsequent transition from the "low" logic state to the "high" logic state of the oscillation signal.

11. The DRAM device of claim 10, wherein:
when the "high" logic states of the self-refresh mode signal and the oscillation signal are overlapped, the logic circuit ceases the providing of the self-refresh request signal, in response to a subsequent transition from the "high" logic state to the "low" logic state of the oscillation signal.

12. The DRAM device of claim 9, wherein the arbitration circuit comprises:
a latch circuit including cascaded first and second flip-flops, each flip-flop having set and reset inputs,
the set and reset inputs of the first flip-flop responding to the self-refresh mode signal and the oscillation signal, respectively,
the set and reset inputs of the second flip-flop responding to an output of the first flip-flop and the oscillation signal, respectively,
the output of the second flip-flop causing the self-refresh request signal to be provided.

13. The DRAM device of claim 12, wherein the logic circuit further comprises:
an AND gate for logically combining the output signal of the second flip-flop and the oscillation signal to produce the logically combined signal as the self-refresh request signal.

14. A method for self-refreshing a dynamic random access memory (DRAM) device having memory cells operated in a self-refresh mode and a non self-refresh mode, the method comprising:
providing a self-refresh mode signal that is enabled and disabled in the self-refresh mode and the non self-refresh mode, respectively;
generating an oscillation signal independent of the self-refresh mode signal;
providing a self-refresh request signal in response to the self-refresh mode signal and the oscillation signal; and
providing an address signal in response to the self-request signal for refreshing relevant memory cells of a wordline selected by the address signal.

15. The method of claim 14, further comprising:
ceasing the providing a self-refresh request signal in response to the self-refresh mode signal and the oscillation signal.

16. The method of claim 15, wherein the step of generating an oscillation signal comprises:
generating a free-run oscillation signal in response to a power signal that is provided in response to an operation status of the DRAM device.

17. The method of claim 16, wherein:
the step of providing a self-refresh mode signal comprises providing a self-refresh mode signal having "high" and "low" logic states;
the step of generating an oscillation signal comprises generating an oscillation signal having "high" and "low" logic states; and
the step of providing a self-refresh request signal comprises providing a self-refresh request signal in response to the logic states of the self-refresh mode signal and the oscillation signal.

18. The method of claim 17, wherein the step of providing a self-refresh request signal comprises:
arbitrating a timing for providing the self-refresh request signal based on the logic states in a case where the self-refresh mode signal and the oscillation signal are in the "high" logic states.

19. The method of claim 18, wherein the step of arbitrating a timing comprises:
in a case where a rising transition of the self-refresh mode signal is earlier than that of the oscillation signal, providing the self-refresh signal in response to a subsequent rising transition of the oscillation signal.

20. The method of claim 18, wherein the step of arbitrating a timing comprises:
in a case where a rising transition of the oscillation signal is earlier than that of the self-refresh mode signal, ceasing the generation of the self-refresh signal in response to a subsequent falling transition of the oscillation signal.

21. A self-refresh controller for use in a dynamic random access memory (DRAM) device selectively operated in a self-refresh mode and a non self-refresh mode, the self-refresh controller comprising:
a detection circuit for providing a self-refresh mode signal in response to the refresh mode selection;
an oscillation circuit for producing an oscillation signal in response to a DRAM power indication signal; and
in response to the self-refresh request signal, an address signal is provided to refresh relevant memory cells of a wordline of the DRAM.

22. The self-refresh controller of claim 21, wherein:
the oscillation circuit produces an oscillation signal during a self-refresh mode and a non self-refresh mode; and
the detection circuit provides a self-refresh mode signal in parallel with the oscillation signal, the self-refresh mode signal being enabled in the self-refresh mode.

* * * * *